United States Patent [19]
Phillips, Jr.

[11] 4,181,919
[45] Jan. 1, 1980

[54] ADAPTIVE SYNCHRONIZING CIRCUIT FOR DECODING PHASE-ENCODED DATA

[75] Inventor: Grover G. Phillips, Jr., Wichita, Kans.

[73] Assignee: NCR Corporation, Dayton, Ohio

[21] Appl. No.: 891,086

[22] Filed: Mar. 28, 1978

[51] Int. Cl.² .............................................. G11B 5/09
[52] U.S. Cl. .................................................... 360/42
[58] Field of Search ............................. 360/42, 51, 67

[56] References Cited
U.S. PATENT DOCUMENTS

| | | | |
|---|---|---|---|
| 3,243,580 | 3/1960 | Welsh | 360/42 |
| 3,696,255 | 10/1972 | King et al. | 360/42 |
| 3,727,202 | 4/1973 | Fort | 360/42 |
| 3,828,167 | 8/1974 | Goldfarb | 360/42 |
| 3,949,394 | 4/1976 | Kennedy | 360/42 |
| 3,979,746 | 9/1976 | Jarrett | 360/42 |

*Primary Examiner*—Vincent P. Canney

*Attorney, Agent, or Firm*—J. T. Cavender; Albert L. Sessler, Jr.; Elmer Wargo

[57] ABSTRACT

A decoding circuit including an adaptive synchronizing circuit for synchronizing to time-encoded data streams with an explicit output for eliminating non-data flux reversals in certain types of phase-encoded data such as Manchester-coded data. A preferred embodiment of the circuit includes a timer having first and second inputs and an output for producing a first state in response to a first signal at the first input, and also includes a means for producing a second state at the output of the timer in response to a predetermined condition at the second input. The circuit also includes additional circuit paths operatively coupling the output of the timer with the second input thereto whereby each of the first and second states are maintained at a relatively stable percentage of the time between successive first signals to the first input when the frequency of successive first signals varies. One of the first and second states of the timer provides a blanking pulse for eliminating the non-data flux reversals.

14 Claims, 4 Drawing Figures

(3A) SYNC. SIGNAL (TR)

(3B) VOLTAGE ACROSS C1

(3C) BLANKING PULSE (3D) TIMER 30 OUTPUT (3E) VOLTAGE AT POINT A (3F) BINARY INPUT DATA (1-1)

(3G) BINARY INPUT DATA (0-0)

(3H) BINARY INPUT DATA (1-0)

(3I) BINARY INPUT DATA (0-1)

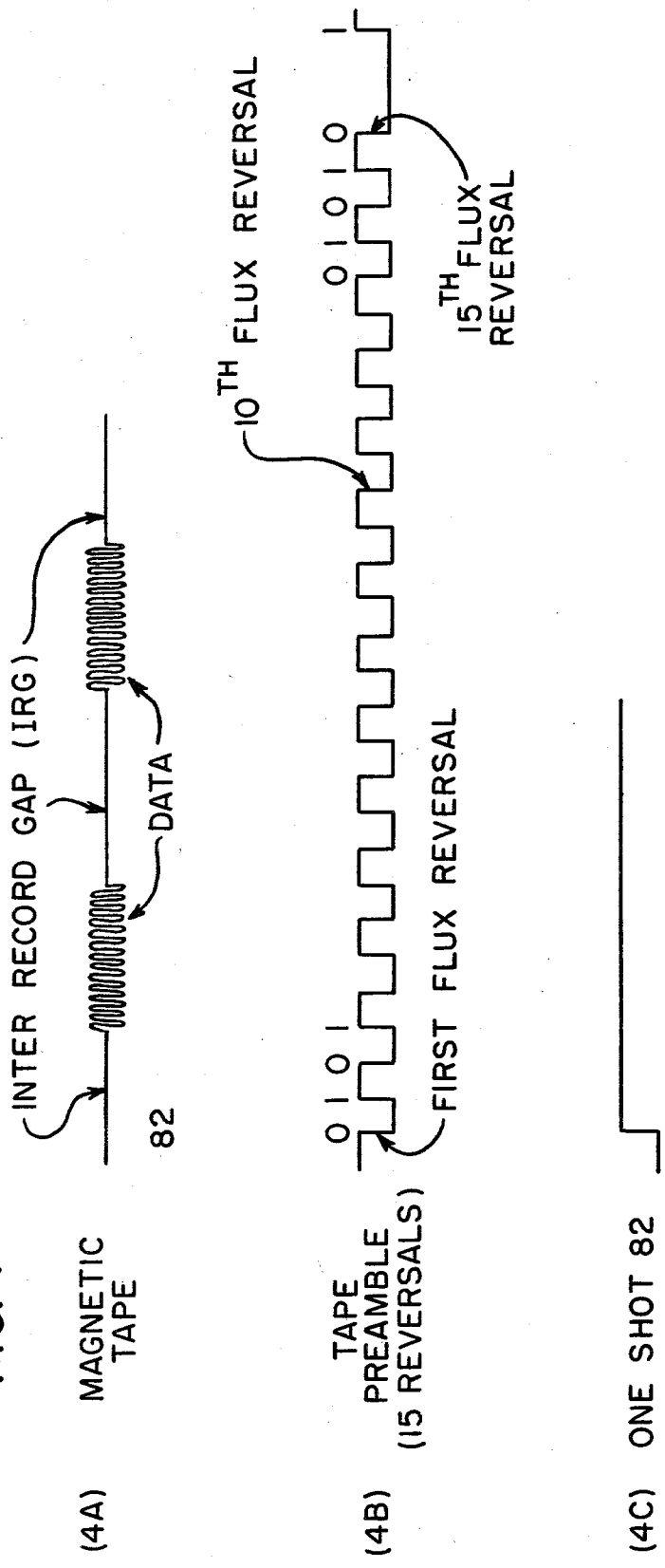

ary of this invention is that it provides an alternative to the classical phase-locked loop. In addition, the adaptive synchronizing circuit of this invention has the features of being adaptable to a wide range of supply voltages, requiring fewer critical components, and not needing adjustments.

These features and advantages along with others will be more readily understood in connection with the following specification, claims, and drawing.

ADAPTIVE SYNCHRONIZING CIRCUIT FOR DECODING PHASE-ENCODED DATA

BACKGROUND OF THE INVENTION

This invention relates to a decoding circuit including an adaptive synchronizing circuit for synchronizing to time-encoded data streams with an explicit output (blanking pulse) for eliminating non-data flux reversals in certain types of phase-encoded data such as Manchester-coded data.

In one type of phase-encoded data of the Manchester type, data to be recorded is divided into cell bits, with the data flux reversals or transitions occurring at the beginning of a bit cell, and with the non-data flux reversals occurring, when they do occur, near the center of a bit cell. These non-data flux reversals are the ones which have to be blanked out or suppressed, as they would provide inaccuracies in the further use of the data if they were to remain in the data stream. U.S. Pat. No. 4,027,335 which issued on May 31, 1977, provides a discussion of the various methods of encoding data and the problems inherent in each method. Blanking circuits are shown in U.S. Pat. No. 3,331,079 which issued on July 11, 1967, U.S. Pat. No. 3,778,798 which issued on Dec. 11, 1973 and U.S. Pat. No. 3,828,167 which issued on Aug. 6, 1974.

One of the problems with prior art blanking circuits is that they are generally not flexible enough to provide for the blanking of non-data flux reversals when the frequency of the incoming data varies considerably, due, for example, to a change in the velocity of a moving record medium from which the data is being read.

Another problem with prior art blanking circuits is that they are expensive to manufacture or require critical components.

SUMMARY OF THE INVENTION

A preferred embodiment of this invention includes an adaptive synchronizing circuit, which may be used, for example, for eliminating non-data flux reversals in certain types of phase-encoded data such as Manchester-coded data. The circuit includes a first means having first and second inputs and an output for producing a first state at the output in response to a first signal at the first input. A second means for producing a second state at the output of the first means in response to a predetermined condition at the second input is also included. Circuit means operatively couple the output of the first means with the second input thereto, whereby each of the first and second states of the first means is maintained at a relatively stable percentage of the time between successive first signals to the first input when the frequency of the first signals varies. One of the first and second states of the first means provides a utilization or blanking pulse for eliminating the non-data flux reversals.

In the preferred embodiment of this invention, the utilization or blanking pulse remains "on" for about 70 percent and "off" for about 30 percent of the time between successive valid data signals in the data stream, regardless of the repetition rate or phase frequency of the associated phase-encoded data. In other words, the blanking pulse will be "on" for a total of about 70 percent of the absolute time between successive signals, regardless of a change in the repetition rate or base frequency of the associated phase-encoded data, although these specific percentage figures may be adjusted to suit a particular application in which the circuit is used.

A feature of this invention is that it provides an alternative to the classical phase-locked loop. In addition, the adaptive synchronizing circuit of this invention has the features of being adaptable to a wide range of supply voltages, requiring fewer critical components, and not needing adjustments.

These features and advantages along with others will be more readily understood in connection with the following specification, claims, and drawing.

BRIEF DESCRIPTION OF THE DRAWING

FIG. 4, consisting of FIGS. 4A-4C show various waveforms associated with the data stream and the decoding circuit.

DETAILED DESCRIPTION OF THE INVENTION

Figure 1:
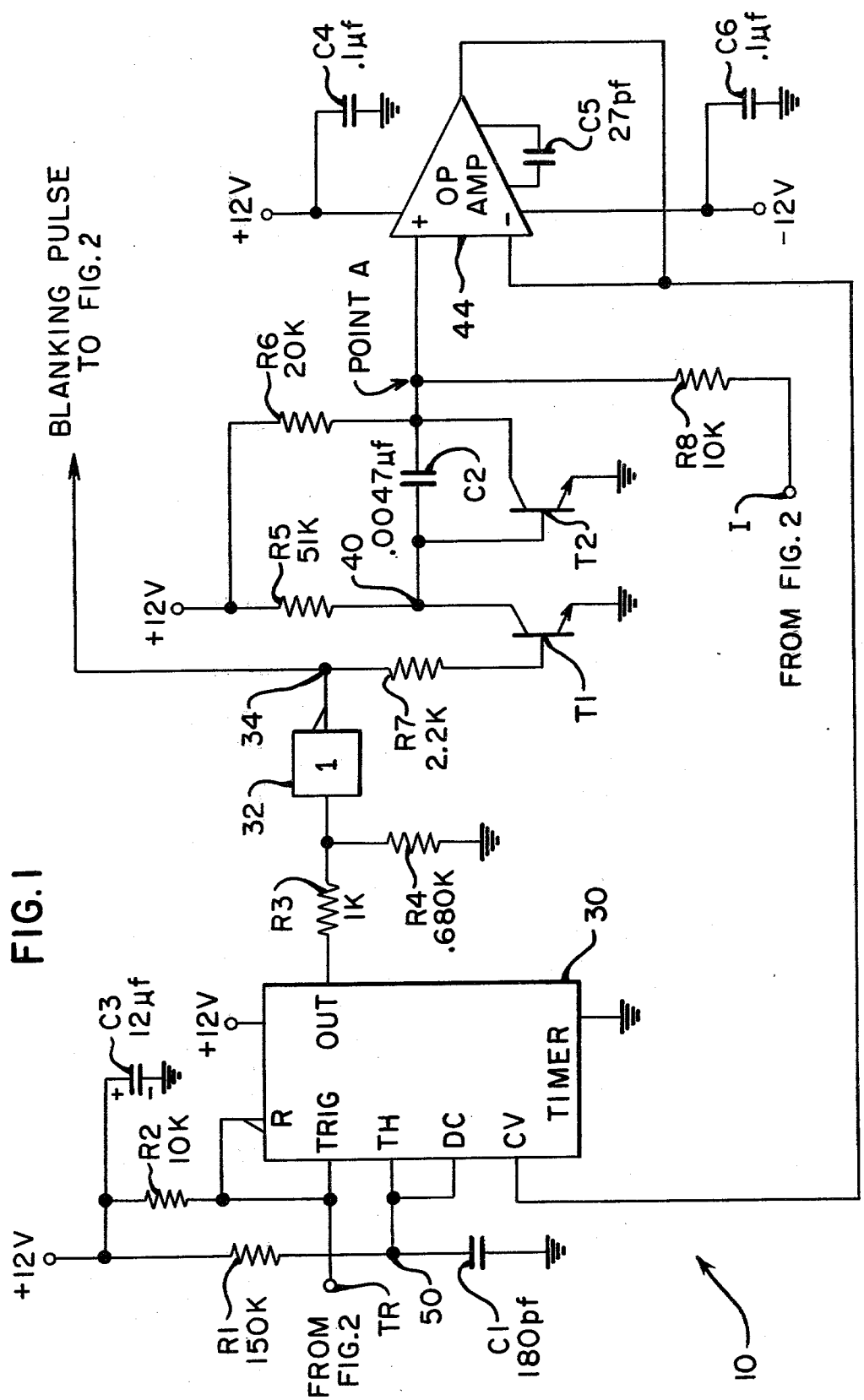
FIG. 1 is a schematic diagram of a preferred embodiment of the adaptive synchronizing circuit of this invention.

FIG. 1 is a schematic diagram of a preferred embodiment of the adaptive synchronizing circuit of this invention which is designated generally as 10; however, before proceeding with a detailed discussion of the circuit, it would be useful to discuss how the blanking pulse from the circuit 10 is utilized.

As stated earlier herein, the circuit 10 may be used for synchronizing to phase-encoded data of the Manchester type. With this type of code, the data to be recorded is divided into cells, with the data flux reversals or transitions occurring at the beginning of a bit cell, and with the non-data flux reversals occurring, when they do occur, near the center of a bit cell. These non-data flux reversals are the ones which have to be blanked out or suppressed, as they would provide inaccuracies in the further use of the data if they were to remain in the data stream.

Figure 3:
FIG. 3, consisting of FIGS. 3A through 3I shows various waveforms associated with the adaptive synchronizing circuit and the data stream.
Figure 3:
Figure 3:
Figure 3:
Figure 3:
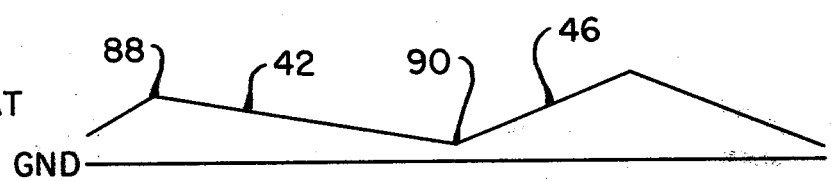
Figure 3:
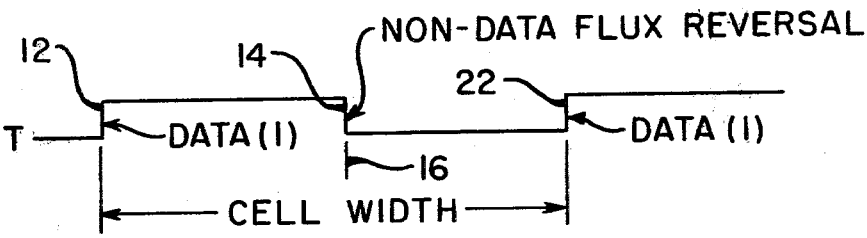
Figure 3:
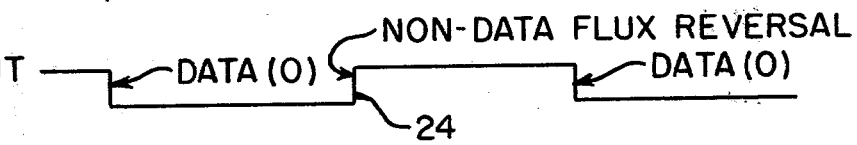
Figure 3:
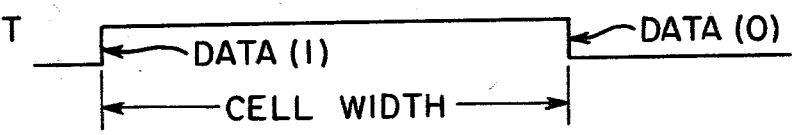
Figure 3:

Lines 3F through 3I of FIG. 3 show various binary input data which occur in the data stream. Line 3C shows the blanking pulse from the circuit 10, showing the various "off" and "on" states of the blanking pulse as they relate to the binary input data shown in the lower part of FIG. 3. From line 3F, it is apparent that the binary data 1 shown by reference numeral 12, occurs during an off period of the blanking pulse shown on line 3C. Shortly after the data 1 is received, the blanking pulse switches to an "on" state. If the binary input data follows the binary 1-1 pattern shown on line 3F, the non-data flux reversal, shown by reference numeral 14, occurs near the center 16 of the cell width; however, it occurs at a point not exceeding 70% of the cell width (as measured from reference numeral 12) for the embodiment described herein. As stated earlier herein, the blanking pulse stays on for approximately 70 percent of the time between successive synchronization or TR signals 18 and 20 shown on line 3A to effectively blank out the unwanted non-data flux reversal. Thereafter, the blanking pulse returns to the off state to enable the binary 1 data, shown by reference numeral 22, to be received. Line 3G similarly shows how the unwanted non-data flux reversal, occurring near the center 24 of the cell, is eliminated during the time that the blanking pulse is on. Line 3H shows the relationship between the blanking pulse and the binary input data when this data follows the pattern of a binary 1 to a binary 0. Line 3I similarly shows the relationship of the blanking pulse to the binary input data when the input data follows the pattern of a binary 0 to a binary 1. It should be noted that when the binary input data follows the patterns shown in lines 3H and 3I, there is no non-data flux reversal occurring near the center of the data cell.

Figure 2:
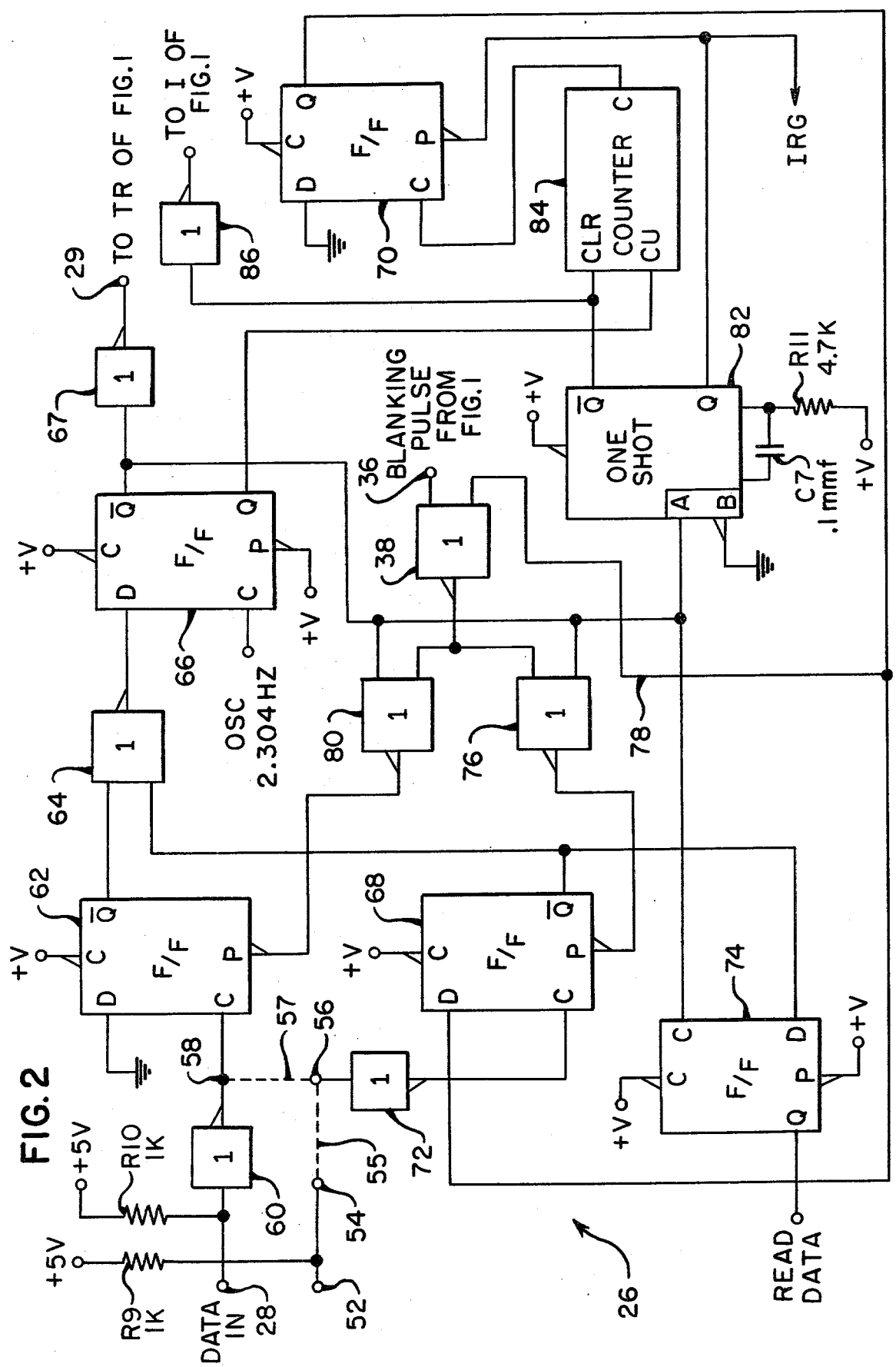
FIG. 2 is a circuit diagram of a decoding circuit of this invention which receives the data stream and a blanking pulse from FIG. 1.

FIG. 2 is the circuit diagram of a decoding circuit which is part of this invention and which is designated generally as 26. The decoding circuit 26 receives the incoming input data at the terminal 28. For the moment, it is sufficient to state that this circuit 26 processes the incoming data stream and eventually produces a synchronizing or a triggering pulse TR at terminal 29. This triggering pulse TR is fed into the triggering terminal of a timer 30 shown in FIG. 1. The timer 30 may be a conventional timer, such as Ne555 which is manufactured by Signetics Corporation. The positive going edge of the synchronizing or triggering pulse TR shown on line 3A of FIG. 3 triggers the timer 30 causing the output of the timer 30 to rise to a high level as shown on line 3D of FIG. 3. The output of the timer 30 is connected to the input of inverter 32 by a series-connected resistor R3. One end of a resistor R4 is connected to the input of the inverter 32 and the remaining end of this resistor is connected to system ground. The resistors R3 and R4 form a voltage divider network which, when combined with the inverter 32, enable the blanking pulse to have the desired polarity and voltage level for use in the decoding circuit 26 shown in FIG. 2. From FIG. 3, it is apparent from line 3D thereon that when the timer output rises to a positive level, the blanking pulse shown on line 3C is turned on. The blanking pulse coming from the output of inverter 32 at junction 34 is connected to input 36 of NOR gate 38 shown on FIG. 2.

At the time that the timer 30 is triggered, a voltage begins to develop across the capacitor C1 shown in FIG. 1. One end of the capacitor C1 is connected to ground and the other end is series-connected through a resistor R1 to a +12 volt source of potential. The voltage which is developed across the capacitor C1 rises at a substantially linear rate as shown by line 3B of FIG. 3.

When the timer 30 in FIG. 1 is triggered, the low level condition on junction 34 passes through the resistor R7 to the base of transistor T1 to keep this transistor turned off. The collector of transistor T1 is connected to a source of +12 volts of potential via a series-connected resistor R5 as shown in FIG. 1. At this time when the junction 34 is at a low level, the collector of transistor T1 is maintained at a high positive potential at junction 40. Because the base of transistor T2 is connected to junction 40, the transistor T2 will begin to conduct. The conduction of transistor T2 occurs at a linear rate due to the Miller effect, and therefore, the voltage potential at point A beings to fall at a gradual rate as shown by reference numeral 42 on line 3E of FIG. 3. The capacitor C2, which is series connected between the junction 40 and point A, begins to discharge at this time, the discharge path being from the source of +12 volts of potential, the resistor R5, and through the collector and emitter of transistor T2 to the ground or reference potential.

Point A in FIG. 1 is connected to an operational amplifier 44, which may be a conventional amplifier such as LM301, which is manufactured by National Semiconductor. Basically, the amplifier 44 operates as a voltage follower and provides for high-impedance buffering within the circuit 10 and also provides a small amount of filtering with an amplification factor of 1. The output of the operational amplifier 44 is connected to the control voltage C.V. input of timer 30. While the voltage level at point A is falling, the voltage level across capacitor C1 is increasing. When the falling voltage level from point A equals the rising voltage level across the capacitor C1, the timer 30 will be triggered, causing the output of the timer to fall to the second or low state shown on line 3D of FIG. 3.

As soon as the output of the timer 30 falls to the low level, the blanking pulse shown on line 3C of FIG. 3 is turned off. When the blanking pulse is turned off, a high level of voltage occurs at junction 34 shown in FIG. 1. The high level of voltage at junction 34 causes the base of transistor T1 to become forward-biased, causing this transistor to immediately conduct to saturation. When the transistor T1 conducts, junction 40 is placed substantially at ground level. This causes the capacitor C2 to be charged by the +12 volt source of potential passing through the resistor R6 through the capacitor C2 to ground or reference potential via the now-conducting transistor T1. The rising voltage which develops across the capacitor C2 is shown by line 46 on line 3E of FIG. 3. When the output of the timer 30 is at its second state or low level, the voltage across capacitor C1 is maintained at ground level as shown by the reference line 48 on line 3B of FIG. 3. When the next triggering signal TR is fed into the timer 30, the process just described is repeated.

The threshold input TH and the DC input to timer 30 are wired together as shown, and both of these inputs are connected to junction 50 as shown in FIG. 1. The triggering and reset input of timer 30 are connected together and are connected to the source of +12 volts potential via a series-connected resistor R2. The capacitor C3, which is connected between the source of +12 volts potential and ground, is there for the purpose of filtering the +20 volts source of potential. The capacitor C5, associated with the operational amplifier 44 is conventionally selected and used to provide the buffering and filtering mentioned earlier herein. Capacitors C4 and C6 provide filtering for the +12 volts and −12 volts sources of potential, respectively. The operation of the circuit 10 will be discussed in more detail after a discussion of the decoding circuit 26 shown in FIG. 2.

The data which is to be decoded by the decoding circuit 26, shown in FIG. 2, is fed into the input terminal 28. This data may come, for example, from a magnetic tape. There are certain initialization procedures associated with the decoding circuit 26 shown in FIG. 2 and the circuit 10 shown in FIG. 1; however, for the moment, assume that the initialization procedures have been completed and that true data now appears on the input terminal 28. The decoding circuit 26 has a second input 52 thereto to provide for those instances in which the data has been separated such that a negative transition on the input terminal 28 represents a binary "zero" data bit and a negative transition on the input terminal 52 represents a binary "one" data bit. When the data signals are separated, a conductor 55 is inserted between the junctions 54 and 56 and no conductor is placed between the junctions 56 and 58. When the data signals are combined, a conductor 57 is placed between the junctions 58 and 56 and no conductor appears between the junctions 54 and 56. This feature provides flexibility in the circuit 26. In the embodiment being described, the synchronizing signal and the data signal come in over terminal 28, consequently, for purposes of this disclosure, the conductor 57 is placed between the junctions 58 and 56.

Assume for the moment, that a negative-going transition occurs at the input terminal 28, signifying a binary 0 being read. The binary 0 from input terminal 28 is inverted by the inverter 60 to provide a positive clocking pulse to the clocking pulse input C of flip-flop 62. Flip-flop 62 is a conventional D-type flip-flop. Because the D input of flip-flop 62 is permanently wired to ground level, the $\overline{Q}$ output of flip-flop 62 will rise to a high level upon receiving the clocking pulse. The $\overline{Q}$ output of flip-flop 62 is fed into one input of a conventional NOR gate 64 whose prior output state was at a high level. Upon receiving the high level output from $\overline{Q}$ of flip-flop 62, the output of NOR gate 64 will fall to a low level. The output of NOR gate 64 is fed into the D input of a conventional D-type flip-flop 66 and the output of a conventional oscillator (not shown) having a frequency of 2.304 Hz is fed into the clocking pulse input C of flip-flop 66. In the embodiment described, the phase-encoded data has a base frequency of 48K Hz. Upon the next positive going transition from the oscillator, the flip-flop 66 will be reset causing the $\overline{Q}$ output thereof to rise to a high level. The $\overline{Q}$ output from flip-flop 66 is inverted by the inverter 67 to provide the negative going triggering pulse TR required to trigger the timer 30 shown in FIG. 1. When the timer 30 is triggered or put into the first state, the blanking pulse shown on line 3C of FIG. 3 will switch to the low level or "on" condition.

As a result of the initialization procedure mentioned earlier herein, a low level signal is maintained on the D input of D-type flip-flop 68, shown in FIG. 2, by the Q output of D-type flip-flop 70. The binary 0 data which was fed into the input terminal 28 and inverted by the inverter 60 in the example being discussed, is inverted again by the inverter 72 to become a low level signal on the clocking pulse input C of flip-flop 68. At this time, the flip-flop 68 is held in the preset condition by a low-level signal being applied to the preset input P of flip-flop 68 via the output of NOR gate 76, causing the $\overline{Q}$ output of flip-flop 68 to be at a low level. The low level output of $\overline{Q}$ of flip-flop 68 is fed into the D input of D-type flip-flop 74. The high level $\overline{Q}$ output of flip-flop 66 which was used to provide the triggering TR pulse for the timer 30 is also used as a clocking pulse for the flip-flop 74, and accordingly, this input is fed into the C input of flip-flop 74 to clock the low level input on the D input thereof into the flip-flop 74, causing the Q output thereof to go to a low level, thereby corresponding to the binary 0 being input to input terminal 28.

The blanking pulse from FIG. 1 is fed into input 36 (FIG. 2) of NOR gate 38. The other input to NOR gate 38 is held at a low level by the low level output from the Q output of flip-flop 70 via line 78. When the blanking pulse is "on" or at a low level, the two low level inputs to the NOR gate 38, will cause the output thereof to rise to a high level. This high level output from NOR gate 38 is fed into one input of NOR gate 80 and is also fed into one input of NOR gate 76. The remaining inputs to NOR gates 80 and 76 are supplied with a high level signal from the $\overline{Q}$ output of flip-flop 66, causing each output of NOR gates 80 and 76 to fall to the low level. The low level output from NOR gate 76 is fed into the preset input P of flip-flop 68 causing this flip-flop to be set with a low level appearing on the $\overline{Q}$ output thereof. Similarly, the low level output from NOR gate 80 is fed into the preset input P of flip-flop 62 causing the $\overline{Q}$ output thereof to remain at a low level. If the second binary bit of data being entered into the decoding circuit 26 at input terminal 28 thereof is a binary 0, then a positive-going, non-data flux reversal would be necessary as shown by reference numeral 24 in line 3G of FIG. 3. This positive-going, non-data flux reversal is fed through the inverter 60, and is again inverted by the inverter 72 to provide a positive-going pulse at the clocking input C of flip-flop 68. Normally, the positive clocking pulse would cause the flip-flop 68 to change state; however, because the flip-flop 68 is held in the set condition by the input to the preset terminal P thereof, no change is made in the output of flip-flop 68. The same situation is true for flip-flop 62, causing the $\overline{Q}$ output of flip-flop 62 to remain a low level. These low level outputs from flip-flops 68 and 62 are fed into the NOR gate 64 causing its output to remain at a high level. The high level output from NOR gate 64, which is fed into the D input of flip-flop 66, causes the $\overline{Q}$ output of flip-flop 66 to remain at a low level. This low level from the $\overline{Q}$ output of flip-flop 66 is fed into the clocking input C of flip-flop 74 to produce no change in the output of flip-flop 74, as a positive clocking pulse is required to change the state thereof. Consequently, the non-data flux reversal which was a positive going pulse in the example being described, is effectively blanked by the circuit 10 shown in FIG. 1.

After a short interval, as shown on line 3C of FIG. 3, the blanking pulse will be switched to the off condition. When the blanking pulse is in the off state, a high level signal is applied to the input 36 of NOR gate 38 shown on FIG. 2, causing the NOR gate to change its output state to a low level. The low level output from NOR gate 38, when fed into the NOR gates 76 and 80, causes each of these gates to switch to a high level output which removes the preset condition from the flip-flops 62 and 68. When the next bit of incoming data, which is a binary 0 in the example being described, is fed into the input terminal 28, the process just described will be repeated. It should be noted that when the data coming into the input terminal 28 is a binary 1, the flip-flop 68 is triggered, and when the incoming data is a binary 0, the flip-flop 62 is triggered to cause the NOR gate 64 to go to the low level condition which is necessary for producing the synchronizing or triggering pulse TR as previously described.

The initialization procedure alluded to earlier herein, will now be described. Assume for the moment that the data being input to terminal 28 of decoding circuit 26 comes from a magnetic tape. While this discussion proceeds in relation to a magnetic tape, it is apparent that this invention may be utilized with other types of mediums including various transmission lines. Line 4A of FIG. 4 shows data as it is received from a magnetic tape. As shown in line 4A, the data is separated by inter-record gaps (IRG). The first inter-record gap designated as 82 on line 4A may be the tape lead-in on which no data is recorded. Because there are no positive or negative transitions on the inter-record gap 82, the $\overline{Q}$ output of flip-flop 66 is in the low level, and this low level signal is fed into the A input of the conventional, retriggerable, monostable multivibrator or one-shot 82 shown in FIG. 2. At this time, the $\overline{Q}$ output of the one-shot 82 is in a low level state, indicating an inter-record gap. At this time, the Q output of one-shot 82 is in a high level state, and this output is fed into the clear input CLR of a conventional decade counter 84. The B input of the one-shot 82 is conventionally tied to a ground level so as to condition the one-shot to trigger when a positive or high level pulse is received at the A input thereto.

The initialization procedure is arranged so that 10 negative-going transitions are required to get the circuit 10 operating at approximately the nominal velocity of the record medium or tape from which the data is being read. As soon as the first negative-going transition is received at the input terminal 28 of the decoding circuit 26, the $\overline{Q}$ output of flip-flop 66 will rise to the high level according to the techniques already explained. The high level output from the $\overline{Q}$ output of flip-flop 66 conditions the one-shot 82 causing it to trigger, thereby placing a high level output on the Q output thereof. At this time, the $\overline{Q}$ output of one-shot 82 will fall to a low level, thereby releasing the counter 84 to start the counting process. The counter 84 is a binary counter which is selected to produce a high level output on the C output thereof when the count on the counter reaches 10 for the pulses coming from the Q output of flip-flop 66. During this time that the first 10 flux reversals are being counted on counter 84, the high level output from Q of flip-flop 70 is fed into the NOR gate 38 over line 78, thereby keeping the output of NOR gate 38 at a low level, which in turn prevents the blanking pulse from having any effect on the output of the decoding circuit 26. During this time that the output of NOR gate 38 is being held at a low level, this condition allows the flip-flop 62 to be preset after a data transition by the positive or high level output $\overline{Q}$ of flip-flop 66. As soon as the tenth flux reversal, as shown on line 4B of FIG. 4 is reached, the high level output from output C of the counter 84 clocks the low level input D into the flip-flop 70, causing the Q output thereof to fall to a low level. The low level output from the Q output of flip-flop 70 conditions the NOR gate 38 to change state when the next blanking pulse is received. When the next blanking pulse (low level) is received, the output of the NOR gate 38 switches to a high level, thereby causing the outputs of the NOR gates 76 and 80 to fall to a low level, thereby causing the preset condition on flip-flops 68 and 62. This permits the blanking pulse to work as previously described.

During the first ten flux reversals shown on line 4B of FIG. 4, the blanking circuit 10 adjusts to the frequency of the incoming preamble signals so that it can thereafter adjust to changes in the frequency of the later incoming data signals. The tape preamble shown on line 4B of FIG. 4 includes an additional five negative-going transitions after the first ten negative-going transitions are received, and the fifteenth negative-going transition is followed by a positive-going transition which indicates to the controller (not shown) associated with the decoding circuit 26 that the preamble is now complete, and that the next bit of data which is received will be actual data.

After the data is received by the decoding circuit 26, a postamble follows the completion of the data to provide another inter-record gap. In the embodiment being described, the postamble consists of a binary 1 followed by fifteen binary 0's. During the time that data is being fed into the input terminal 28 of the decoding circuit 26, the Q output of one-shot 82 remains at a high level as shown by line 4C of FIG. 4. If there is no data coming into the decoding circuit 26 for a period equivalent to seven data cell widths, the output of the one-shot 82 will change, causing the Q output thereof to fall to a low level, and correspondingly, the $\overline{Q}$ output thereof will rise to a high level. The period for the one-shot 82 is conventionally determined by the capacitor C7 and the resistor R11 shown in FIG. 2.

The blanking circuit 10 is initialized following an inter-record gap in the magnetic tape as shown on line 4A of FIG. 4 by association with the $\overline{Q}$ output of one-shot 82 shown in FIG. 2. Prior to a first signal coming into the data input terminal 28 of the decoding circuit 26, the $\overline{Q}$ output of one-shot 82 will be at a high level. As soon as the one-shot 82 is triggered by the $\overline{Q}$ output of flip-flop 66 in response to the first data coming into input terminal 28, the $\overline{Q}$ output of one-shot 82 will fall to a low level. The low level output from the $\overline{Q}$ output of one-shot 82 is fed into the inverter 86 to produce a positive or high level input to input terminal I shown in FIG. 1. This high level output from inverter 86 passes through the resistor R8 to point A in the blanking circuit 10 to provide the necessary reference voltage level at point A to get the circuit 10 tracking. The same output from $\overline{Q}$ of flip-flop 66 which triggers the one-shot 82 also provides the triggering pulse TR to the timer 30 so as to put the blanking pulse in the on state as previously described.

As stated earlier herein, the blanking pulse stays on for a fixed percentage of the time between successive data signals being fed into the input terminal 28 of the coding circuit 26. Similarly, the off period for the blanking pulse stays on for a fixed percentage of the time between such successive data signals. In the embodiment being described, the blanking pulse stays on for about 70 percent of the time between successive data signals regardless of changes in the frequency of the incoming data. Similarly, the off period for the blanking pulse comprises about 30 percent of the total time between successive input data signals; however, these percentages can be varied to suit a particular application. The percentages of the times that the blanking pulse is on and off are controlled by the resistors R5 and R6 along with the capacitor C2 shown in FIG. 1. It is the relationship between the values of the resistors R5 and R6 which establish the on and off times for the blanking pulse. Capacitor C2 in conjunction with resistors R5 and R6 set the tracking response of the circuit 10; in other words, they set the rate at which the circuit 10 can change or respond from a nominal value. In the embodiment described, the circuit 10 can track a ±100% variation in the base frequency of the incoming data stream with some acceptable degradation of the duty cycle.

With regard to the tracking of the circuit 10, point 88 on line 3E of FIG. 3 represents the point in time when transistor T1 is turned off and transistor T2 is turned on. During this time, the voltage reference level at point A in the circuit begins to gradually and linearly fall as shown by line 42 on line 3E. Point 90 on line 3E represents the point in time when transistor T1 is turned on and transistor T2 is turned off. When transistor T1 is turned on, the voltage across the capacitor C2 begins to rise as indicated by reference numeral 46 on line 3E for the reference potential at point A. If the media transport which is moving the magnetic tape being read in the example given begins to speed up, then the incoming data signal will arrive sooner than was normally expected, and consequently, the voltage at point A (at line 46) will not rise to the high level shown in line 3E in FIG. 3. Consequently, when the timer 30 is triggered by the triggering pulse TR, the blanking pulse will change states, going from the off to the on state. At this time, the voltage across the capacitor C1 begins to increase in value as shown on line 3B of FIG. 3. From the prior cycle, because the voltage rising at point A in FIG. 1 did not rise to its normally higher state, when the voltage potential at point A is fed into the C.V. input of the timer 30 via the operational amplifier 44, the control voltage at the C.V. input timer 30 will equal the voltage developed across the capacitor C1 at a time sooner than the time at which the timer 30 would be triggered when the media transport is moving the magnetic tape at its normal nominal velocity.

Thus, it can be seen that the circuit 10 provides an alternative to the classical phase-locked loop, it has fewer components, and it has an adjustable duty cycle not provided for by a phase-locked loop. In addition, the circuit 10 provides the additional features of being adaptable to a wide range of supply voltages, requires no adjustments, and requires fewer critical components.

What is claimed is:

1. A circuit for providing a blanking pulse comprising:
   a first means having first and second inputs and an output for producing a first state at said output in response to a first signal at said first input;
   a second means for producing a second state at said output in response to a predetermined condition at said second input; and
   circuit means operatively coupling said output with said second input whereby each of said first and second states is maintained at a relatively stable percentage of the time between successive first signals to said first input when the frequency of said first signals varies, with one of said first and second states of said first means providing said blanking pulse;
   said second means including means for producing an increasing voltage starting with a said first signal; and
   said circuit means having a voltage reference point therein and a circuit path for producing a falling voltage level at said reference point in response to said first state; and
   means operatively coupling said reference point with said second input whereby said first means is shifted to said second state when the falling voltage level at said second input equals the rising voltage produced by said second means.

2. The circuit as claimed in claim 1 in which said circuit means includes a second circuit path for producing a rising voltage level at said reference point when the output of said first means is in said second state.

3. The circuit as claimed in claim 2 in which said first circuit path and said second circuit path include a common capacitor.

4. The circuit as claimed in claim 3 in which said circuit path includes a first impedance in series with said common capacitor and said second circuit path includes a second impedance in series with said common capacitor, said first and second resistors having impedance values corresponding to the durations of time in which said output is in said first and second states, respectively.

5. The circuit as claimed in claim 4 in which said circuit path includes a first transistor which conducts when said first means is in said first state to cause the voltage level at said reference point to fall, and said second circuit path includes a second transistor which conducts when said first means is in said second state to cause the voltage level at said reference point to rise.

6. The circuit as claimed in claim 5 in which said first means includes a timer and said means operatively coupling said reference point with said second input includes an operational amplifier.

7. A circuit for decoding a data stream including data bits and non-data flux reversals comprising:
   input means for receiving said data bits and non-data flux reversals;
   output means operatively coupled to said input means to output the decoded data stream; and
   means for producing a blanking pulse for blanking said non-data flux reversals, comprising:
   a first means having first and second inputs and an output for producing a first state at said output in response to a first signal at said first input, with said first signal being derived from a said data bit at said input means;
   a second means for producing a second state at said output in response to a pedetermined condition at said second input; and
   circuit means operatively coupling said output with said second input whereby each of said first and second states is maintained at a relatively stable percentage of the time between successive first signals to said first input when the frequency of said first signals varies, with one of said first and second states of said first means providing said blanking pulse;
   said second means including means for producing an increasing voltage starting with a said first signal; and
   said circuit means having a voltage reference point therein and a circuit path for producing a falling voltage level at said reference point in response to said first state; and
   means operatively coupling said reference point with said second input whereby said first means is shifted to said second state when the falling voltage level at said second input equals the rising voltage produced by said second means.

8. The circuit as claimed in claim 7 in which said circuit means includes a second circuit path for producing a rising voltage level at said reference point when the output of said first means is in said second state.

9. The circuit as claimed in claim 8 in which said circuit path and said second circuit path include a common capacitor.

10. The circuit as claimed in claim 9 in which said circuit path includes a first resistor in series with said common capacitor and said second circuit path includes a second resistor in series with said common capacitor, said first and second resistors having resistance values corresponding to the durations of time in which said output is in said first and second states, respectively, with one of said first and second states corresponding to approximately 70% of the time between said successive first signals.

11. The circuit as claimed in claim 10 in which said circuit path includes a first transistor which conducts when said first means is in said first state to cause the voltage level at said reference point to fall, and said second circuit path includes a second transistor which conducts when said first means is in said second state to cause the voltage level at said reference point to rise.

12. The circuit as claimed in claim 11 in which said first means includes a timer and said means operatively coupling said reference point with said second input includes an operational amplifier.

13. The circuit as claimed in claim 12 further comprising means for enabling said blanking pulse to blank said non-data flux reversals after a predetermined pattern in said data stream is received at said input means.

14. An adaptive synchronizing circuit for synchronizing to a periodic data stream comprising:
   a first means having first and second inputs and an output for producing a first state at said outputs in response to a first signal from said data stream at said first input;
   a second means for producing a second state at said output in response to a predetermined condition at said second input;
   circuit means operatively coupling said output with said second input whereby each of said first and second states is maintained at a relatively stable percentage of the time between successive first signals from said data stream to said first input when the frequency of said first signals varies, with one of said first and second states of said first means providing a utilization pulse corresponding in time to one of said first and second states;
   said second means including means for producing an increasing voltage starting with a said first signal; and
   said circuit means having a voltage reference point therein and a circuit path for producing a falling voltage level at said reference point in response to said first state; and
   means operatively coupling said reference point with said second input whereby said first means is shifted to said second state when the falling voltage level at said second input equals the rising voltage produced by said second means.

* * * * *